(12) United States Patent
Sytsma et al.

(10) Patent No.: US 7,061,586 B2
(45) Date of Patent: Jun. 13, 2006

(54) LITHOGRAPHIC APPARATUS AND DEVICE MANUFACTURING METHOD

(75) Inventors: Joost Sytsma, Eindhoven (NL); Pieter Willem Herman de Jager, Rotterdam (NL)

(73) Assignee: ASML Netherlands BV, Veldhoven (NL)

( * ) Notice: Subject to any disclaimer, the term of this patent is extended or adjusted under 35 U.S.C. 154(b) by 156 days.

(21) Appl. No.: 10/790,257

(22) Filed: Mar. 2, 2004

(65) Prior Publication Data

US 2005/0195380 A1 Sep. 8, 2005

(51) Int. Cl.
*G03B 27/72* (2006.01)
*G03B 27/42* (2006.01)

(52) U.S. Cl. .......................................... 355/69; 355/53
(58) Field of Classification Search ................. 355/53, 355/67–71; 250/548; 356/399–401
See application file for complete search history.

(56) References Cited

U.S. PATENT DOCUMENTS

| | | | |
|---|---|---|---|
| 5,500,736 A | | 3/1996 | Koitabashi et al. |
| 5,523,193 A | | 6/1996 | Nelson |
| 5,530,482 A | | 6/1996 | Gove et al. |
| 5,579,147 A | | 11/1996 | Mori et al. |
| 5,677,703 A | | 10/1997 | Bhuva et al. |
| 5,808,797 A | | 9/1998 | Bloom et al. |
| 5,892,573 A | * | 4/1999 | Takahashi et al. ............. 355/61 |
| 5,982,553 A | | 11/1999 | Bloom et al. |
| 6,051,842 A | * | 4/2000 | Yamamoto .................. 250/548 |
| 6,133,986 A | | 10/2000 | Johnson |
| 6,177,980 B1 | | 1/2001 | Johnson |
| 6,229,639 B1 | | 5/2001 | Ozarski et al. |
| 6,687,041 B1 | | 2/2004 | Sandstrom |
| 6,747,783 B1 | | 6/2004 | Sandstrom |
| 6,795,169 B1 | | 9/2004 | Tanaka et al. |
| 6,803,991 B1 | * | 10/2004 | Mori ........................... 355/53 |
| 6,806,897 B1 | | 10/2004 | Kataoka et al. |
| 6,811,953 B1 | | 11/2004 | Hatada et al. |
| 6,882,407 B1 | * | 4/2005 | Asaishi ........................ 355/68 |
| 6,930,755 B1 | * | 8/2005 | Van Der Mast ............... 355/53 |
| 2003/0081303 A1 | * | 5/2003 | Sandstrom et al. ......... 359/291 |
| 2003/0179352 A1 | | 9/2003 | Van Der Mast |
| 2004/0041104 A1 | | 3/2004 | Liebregts et al. |
| 2004/0130561 A1 | | 7/2004 | Jain |

FOREIGN PATENT DOCUMENTS

EP 1 482 375 A2 12/2004

OTHER PUBLICATIONS

European Search Report, from European Appl. No. 05250894.2, 4 pages, dated Jun. 27, 2005.

* cited by examiner

*Primary Examiner*—Henry Hung Nguyen
(74) *Attorney, Agent, or Firm*—Sterne, Kessler, Goldstein & Fox P.L.L.C.

(57) ABSTRACT

A detector, feedback and compensation system for use with a radiation distribution system for distributing the radiation from a radiation system to two or more arrays of individually controllable elements, each for patterning beams of radiation, which are subsequently projected onto a substrate. The detector determines the radiation lost in the radiation distribution system and feeds this information back to a compensation system, which compensates for the loss and keeps the radiation projected onto the substrate uniform.

22 Claims, 4 Drawing Sheets

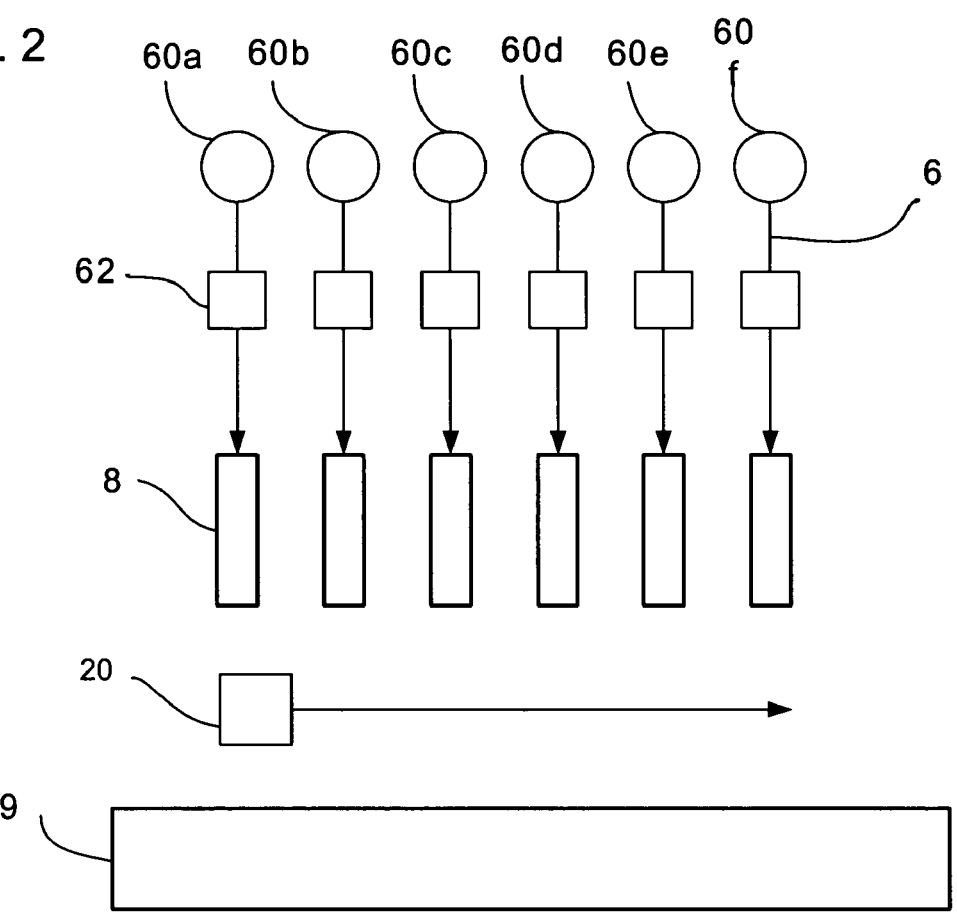

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. Lithographic apparatuses can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (resist). Instead of a mask, the patterning device may comprise an array of individually controllable elements, which serve to generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning"-direction) while synchronously scanning the substrate parallel or anti-parallel to this direction.

In lithographic projection apparatus using arrays of individually controllable elements, it is often necessary to use a plurality of such arrays in order to expose the pattern on a substrate sufficiently quickly that the though-put time for a substrate being exposed in the apparatus is economical. Furthermore, each array requires a relatively large amount of space around it for its support services such as data or control lines required for setting the pattern on each array. It is therefore not appropriate simply to illuminate all of the arrays simultaneously with a single illumination field. Illuminating all arrays with a single illumination field has the further disadvantage that a high proportion of the illumination or radiation is lost (i.e. the illumination which is transmitted between the arrays and is not received by the arrays) and might reflect off other surfaces in the lithographic apparatus, causing unwanted variations in intensity at the arrays. There may therefore be included a system that distributes radiation to a plurality of arrays from a plurality of radiation sources and/or via a plurality of radiation distribution channels.

Clearly, the radiation which passes through the radiation distribution channels can remain as uniform as possible. The prior art describes a system which is adapted to monitor continuously the radiation at the source by using a detector which is placed behind a 99% mirror at the output of a radiation source, the 99% of the radiation beam being directed to the patterning device and the remaining 1% being directed to the detector which measures the radiation intensity. This detector effectively measures the intensity of the radiation as it goes into the patterning device but not the intensity that is actually projected onto the substrate. To this end, the prior art also describes a static detector that is placed alongside the substrate. The static detector is moved into the radiation beam at set intervals in between exposures of substrates. The problem with this is that this system presumes that the transmission of the optical path between the 99% mirror and the substrate does not change between the times during which the beam intensity is sensed by the detector. Furthermore, in the case where the beam is divided into a plurality of radiation distribution channels, or in the case where there are a plurality of radiation sources, there has to be a detector for each channel and these detectors all have to be calibrated and their outputs compared to ensure that all the channels are distributing radiation of the same (or at least correct) intensity.

A further problem with the prior art is that if a variation in intensity is sensed, it is presumed to be at the radiation source that the variation occurs and the radiation source is adjusted accordingly. The detectors do not take into account variations in intensity being caused by defective individually controllable elements in the patterning device.

SUMMARY OF THE INVENTION

An embodiment of the present invention can provide a system for measuring the radiation intensity of a plurality of radiation distribution channels and to compensate for any variation in this measured intensity.

Another embodiment of the present invention provides a lithographic projection apparatus including a radiation system for providing a beam of radiation, a substrate table for holding a substrate, a plurality of patterning device for patterning a beam of radiation derived from the radiation system according to a desired pattern, a projection system for projecting the patterned beam onto a target portion of the substrate, a radiation distribution device that distributes the radiation from the radiation system to the patterning device, wherein the radiation distribution device directs the radiation from the radiation system to a plurality of radiation distribution channels; and the radiation distribution channels providing the beams of radiation to the patterning device, a radiation detection system for measuring the intensity of the radiation associated with each of the patterning device. The radiation distribution channels may constitute a beam of radiation or they may be physical optical channels that direct the radiation.

This arrangement provides an easily controlled device for dividing the illumination system, for example, between the patterning device. For example, the proportions of the beam of radiation that are reflected by each of the successive partially reflective surfaces to the associated radiation distribution channels may be selected such that the intensity of the beam of radiation directed to each of the radiation distribution channels is the same. Since these proportions are substantially time-constant, a variation from a perfectly equal distribution of the radiation intensity of the beam of radiation from the illumination system can be measured and therefore, subsequently, be compensated for.

The radiation detection system preferably includes a detector, which sequentially detects radiation associated with each patterning device in turn. A movable detector can eliminate the need for a detector for each radiation distribution channel. A series of detectors like this would require calibration and be a potential risk to accuracy of the lithographic system.

The detector is preferably arranged to move across a portion of the radiation associated with each of the patterning device. A portion of the radiation may be taken out of its normal course by the use of a partial mirror, for example, and the detector moved across this removed portion in order to enable the detection of the intensity of the radiation even while the lithographic apparatus is in use.

The lithographic projection system preferably includes a probe associated with the detector, wherein the detector is static and the probe moves across a portion of the radiation associated with each of the patterning device, instead of the whole detector moving. This can be used in situations where there is not enough space for a detector in the relevant part of the lithographic apparatus, but there is space for a probe such as an optic fiber, which is smaller and, in certain circumstances, easier to manipulate.

The radiation detection system may include a detector associated with each of the patterning device, rather than a single detector used for all the patterning device. This might be useful in the case, for instance, where each patterning device has a separate radiation source and each source needs to be constantly monitored for fluctuations in radiation intensity.

The radiation detection system may be arranged to detect radiation at the exit of the radiation distribution system. This is at a point where the radiation has been distributed by the radiation distribution system and is en route to the radiation distribution channels. This can be desirable to monitor the radiation intensity because any fluctuations caused buy the radiation distribution system will be picked up.

The radiation detection system may alternatively or additionally be arranged to detect radiation at the exit of the distribution channel. In this case, the channels are limited to a physical entity that directs the radiation. This detector will pick up any fluctuations in the channels. If there are detectors both after the radiation distribution system and after the channels, the detector outputs may be compared to determine where a fluctuation in radiation intensity stems from.

The detection system may alternatively or additionally be arranged to detect radiation between the patterning device and the projection system. There may be a detector for each channel or a single detector for all the channels combined, depending on the layout of the lithographic apparatus. Fluctuations due to the patterning device can therefore be monitored.

The detection system may alternatively or additionally be arranged to detect radiation at the exit of the projection system. At this point, the radiation is directed to the substrate and so it is important to detect the radiation in its final form. This may be done between substrates as a calibration step, or a portion of the radiation may be directed to the detector for detection during the lithographic process. A detector at each of the above points in the lithographic apparatus enables the reason for the fluctuation to be pinpointed and compensated most efficiently. For example, if the illumination source is faulty, it may be most efficient to compensate for it at the source rather than try to make up for the fault later on in the apparatus.

The lithographic projection apparatus preferably includes a compensation system for adjusting the intensity of the radiation, which is associated with at least one patterning device, and which is projected by the projection system. The combination of the detector and the compensation device ensures the correct intensity is used for every pattern that is projected onto the substrate, increasing the efficiency of the patterning system. The compensation system may be used during calibration or in real-time while a substrate is being projected on.

The compensation system is preferably arranged to adjust the intensity of the radiation associated with each of the patterning device independently.

Preferably, at least one of the patterning device is an array of individually controllable elements that can be set to impart a beam of radiation with a desired pattern in its cross-section; each independently controllable element can be set to one of a plurality of states, each of which directs a different proportion of the radiation to the projection system; and wherein the compensation system adjusts the radiation by changing the settings for each of the individually controllable elements such that the pattern of the radiation is maintained but the intensity is changed.

The compensation device preferably includes a radiation attenuator for attenuating the radiation, which is associated with at least one patterning device, and which is projected by the projection system. An attenuator is useful for attenuating radiation in cases where the radiation intensity is higher than it should be for the system and excess radiation needs to be removed.

The compensation system may be arranged to adjust the intensity of a proportion of the radiation, which is associated with at least one patterning device, and which is projected by the projection system. This proportion of the radiation may be one which is intended to be projected onto a specific part of the target portion of the substrate or one which is associated with one of a plurality of patterning device, etc.

Of course, all of the forms of compensation (attenuators, etc) apply equally when adjusting a proportion of the beam as when adjusting the entirety of the beam.

The lithographic projection apparatus preferably includes a control system for updating the compensation system with pre-detected and stored radiation intensity data during a time interval during which radiation is projected onto a portion of the substrate. This allows real-time compensation for fluctuations in the radiation intensity. For example, if a fluctuation in intensity is detected before the radiation is patterned by the patterning device, a feedback system may be employed to enable the patterning device to compensate for this fluctuation in the intensity as the radiation enters the patterning device. Gradual changes in intensity may also be compensated by the feedback and control system.

The lithographic projection apparatus preferably includes a control system for updating the compensation system with pre-detected radiation intensity data during a time interval during which radiation is projected onto a portion of the substrate, wherein the pre-detected radiation intensity data refers to data detected by the radiation detection system in advance and stored in a storage medium. In order to calibrate the system, the intensity variations are monitored and this data is stored and used to compare with later detection system data. The variations can therefore be compensated for during projection of the radiation onto substrates (i.e., in real time).

The stored data is preferably a measure of the intensity variation when the patterning device has a plain pattern. When a measurement is taken in advance of the actual projection onto the substrate, for calibration purposes, for example, the patterning device is set to have a plain pattern (i.e., all the individually controllable elements are set to the same state, for example to direct a maximum intensity). The radiation intensities are then compared to ensure that all parts of the lithographic apparatus are working and aligned, etc.

The radiation detection system may be arranged to detect variation in radiation intensity in the radiation distribution system and/or the radiation distribution channels for each of the patterning device and the compensation system is arranged to compensate for this variation in radiation intensity.

The radiation detection system may alternatively or additionally be arranged to detect variation in radiation intensity in the projection system for each of the patterning device and the compensation system is arranged to compensate for this variation in radiation intensity.

A still further embodiment of the present invention provides a method of calibrating the radiation intensity in a lithographic projection apparatus including steps of detecting the intensity of the radiation at any of a number of stages in the lithographic projection apparatus when the patterning device have a plain pattern, storing the radiation intensity data for any of the number of stages in a storage medium, detecting the intensity of the radiation at the same stages in the lithographic projection apparatus while it is in use, using a control system to compare the stored data with data acquired while the lithographic projection apparatus is in use, and using a compensation system to adjust the intensity of the radiation in accordance with an output of the control system.

A still further aspect of the present invention provides a device manufacturing method including the steps of providing a substrate, providing a projection beam of radiation using a radiation system, using a plurality of patterning device to pattern beams of radiation derived from the radiation system according to a desired pattern, projecting the patterned beams of radiation onto a target portion of the substrate, and using a radiation distribution device to distribute the radiation from the radiation system to the patterning device via a plurality of radiation distribution channels, using a radiation detector to measure the radiation intensity in the radiation distribution channels.

A still further embodiment of the present invention provides a device manufacturing method including the steps of providing a substrate, providing a projection beam of radiation using a radiation system, using a plurality of patterning device to pattern beams of radiation derived from the radiation system according to a desired pattern, projecting the patterned beams of radiation onto a target portion of the substrate, and using a radiation distribution device to distribute the radiation from the radiation system to the patterning device via a plurality of radiation distribution channels, using a radiation detector to measure the radiation intensity in the radiation distribution channels, the radiation detector outputting an intensity value for each of the radiation distribution channels, and compensating for any difference in the radiation intensity of the radiation distribution channels.

According to a further aspect of the invention, there is provided a device manufactured according to the above-referenced device manufacturing method and/or by the above-referenced lithographic apparatus.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 2 depicts the arrangement of part of the apparatus according to a first embodiment of the invention.

The present invention will now be described with reference to the accompanying drawings. In the drawings, like reference numbers may indicate identical or functionally similar elements.

DETAILED DESCRIPTION OF THE INVENTION

Overview and Terminology

Figure 1:
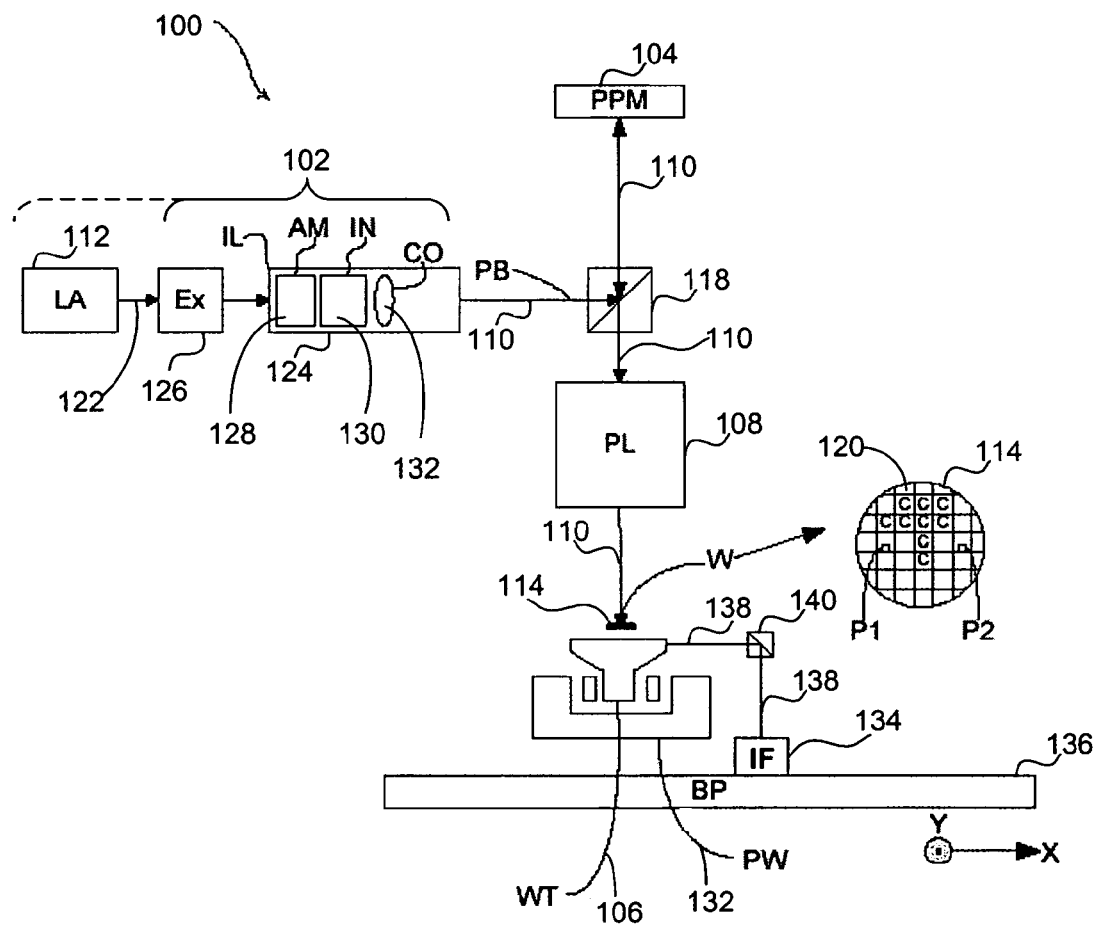
FIG. 1 depicts a lithographic apparatus according to an embodiment of the invention.

The term "array of individually controllable elements" as here employed should be broadly interpreted as referring to any means that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning device may include the following.

A programmable mirror array. This may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical Micro Electro-Mechanical Systems (MEMS) devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic device.

In both of the situations described above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Lithographic Projection Apparatus

FIG. 1 schematically depicts a lithographic projection apparatus 100 according to an embodiment of the invention. Apparatus 100 includes at least a radiation system 102 (e.g., EX, IL (e.g., AM, IN, CO, etc.) etc.), an array of individually controllable elements PPM 104, an object table WT 106 (e.g., a substrate table), and a projection system ("lens") PL 108.

Radiation system 102 can be used for supplying a projection beam PB 110 of radiation (e.g., UV radiation), which in this particular case also comprises a radiation source LA 112.

Array of individually controllable elements 114 (e.g., a programmable mirror array) can be used for applying a pattern to the projection beam 110. In general, the position of the array of individually controllable elements 114 can be fixed relative to projection system 108. However, in an alternative arrangement, an array of individually controllable elements 114 may be connected to a positioning device (not shown) for accurately positioning it with respect to projection system 108. As here depicted, individually controllable elements 114 are of a reflective type (e.g., have a reflective array of individually controllable elements).

Object table 106 can be provided with a substrate holder (not specifically shown) for holding a substrate W 114 (e.g., a resist-coated silicon wafer or glass substrate) and object table 106 can be connected to positioning device PW 116 for accurately positioning substrate 114 with respect to projection system 108.

Projection system (e.g., a lens) 108 (e.g., a quartz and/or CaF$_2$ lens system or a catadioptric system comprising lens elements made from such materials, or a mirror system) can be used for projecting the patterned beam received from beam splitter 118 onto a target portion C 120 (e.g., one or more dies) of the substrate 114. The projection system 108 may project an image of the array of individually controllable elements 114 onto the substrate 114. Alternatively, the projection system 108 may project images of secondary sources for which the elements of the array of individually controllable elements 114 act as shutters. The projection system 108 may also comprise a micro lens array (MLA) to form the secondary sources and to project microspots onto the substrate 114.

The source 112 (e.g., an excimer laser) can produce a beam of radiation 122. This beam 122 is fed into an illumination system (illuminator) IL 124, either directly or after having traversed conditioning device 126, such as a beam expander Ex, for example. The illuminator 124 may comprise adjusting device AM 128 for setting the outer and/or inner radial extent (commonly referred to as σ-outer and σ-inner, respectively) of the intensity distribution in the beam 122. In addition, it will generally comprise various other components, such as an integrator IN 130 and a condenser CO 132. In this way, the beam 110 impinging on the array of individually controllable elements 114 has a desired uniformity and intensity distribution in its cross-section.

It should be noted, with regard to FIG. 1, that the source 112 may be within the housing of the lithographic projection apparatus 100 (as is often the case when the source 112 is a mercury lamp, for example). In alternative embodiments, source 112 may also be remote from the lithographic projection apparatus 100. In this case, radiation beam 122 would be led into the apparatus 100 (e.g., with the aid of suitable directing mirrors). This latter scenario is often the case when the source 112 is an excimer laser. It is to be appreciated that both of these scenarios are contemplated within the scope of the present invention.

The beam 110 subsequently intercepts the array of individually controllable elements 114 after being directing using beam splitter 118. Having been reflected by the array of individually controllable elements 114, the beam 110 passes through the projection system 108, which focuses the beam 110 onto a target portion 120 of the substrate 114.

With the aid of the positioning device 116 (and optionally interferometric measuring device IF 134 on base plate BP 136 that receives interferometric beams 138 via beam splitter 140), the substrate table 106 can be moved accurately, so as to position different target portions 120 in the path of the beam 110. Where used, the positioning device for the array of individually controllable elements 114 can be used to accurately correct the position of the array of individually controllable elements 114 with respect to the path of the beam 110, e.g., during a scan. In general, movement of the object table 106 is realized with the aid of a long-stroke module (course positioning) and a short-stroke module (fine positioning), which are not explicitly depicted in FIG. 1. A similar system may also be used to position the array of individually controllable elements 114. It will be appreciated that the projection beam 110 may alternatively/additionally be moveable while the object table 106 and/or the array of individually controllable elements 114 may have a fixed position to provide the required relative movement.

In an alternative configuration of the embodiment, the substrate table 106 may be fixed, with the substrate 114 being moveable over the substrate table 106. Where this is done, the substrate table 106 is provided with a multitude of openings on a flat uppermost surface, gas being fed through the openings to provide a gas cushion which is capable of supporting the substrate 114. This is conventionally referred to as an air bearing arrangement. The substrate 114 is moved over the substrate table 106 using one or more actuators (not shown), which are capable of accurately positioning the substrate 114 with respect to the path of the beam 110. Alternatively, the substrate 114 may be moved over the substrate table 106 by selectively starting and stopping the passage of gas through the openings.

Although the lithography apparatus 100 according to the invention is herein described as being for exposing a resist on a substrate, it will be appreciated that the invention is not limited to this use and the apparatus 100 may be used to project a patterned projection beam 110 for use in resistless lithography.

The depicted apparatus 100 can be used in four preferred modes:

1. Step mode: the entire pattern on the array of individually controllable elements 114 is projected in one go (i.e., a single "flash") onto a target portion 120. The substrate table 106 is then moved in the x and/or y directions to a different position for a different target portion 120 to be irradiated by the beam 110.

2. Scan mode: essentially the same as step mode, except that a given target portion 120 is not exposed in a single "flash." Instead, the array of individually controllable elements 114 is movable in a given direction (the so-called "scan direction", e.g., the y direction) with a speed v, so that the projection beam 110 is caused to scan over the array of individually controllable elements 114. Concurrently, the substrate table 106 is simultaneously moved in the same or opposite direction at a speed V=Mv, in which M is the magnification of the projection system 108. In this manner, a relatively large target portion 120 can be exposed, without having to compromise on resolution.

3. Pulse mode: the array of individually controllable elements 114 is kept essentially stationary and the entire pattern is projected onto a target portion 120 of the substrate 114 using a pulsed radiation system 102. The substrate table 106 is moved with an essentially constant speed such that the projection beam 110 is caused to scan a line across the substrate 106. The pattern on the array of individually controllable elements 114 is updated as required between pulses of the radiation system 102 and the pulses are timed such that successive target portions 120 are exposed at the required locations on the substrate 114. Consequently, the projection beam 110 can scan across the substrate 114 to expose the complete pattern for a strip of the substrate 114. The process is repeated until the complete substrate 114 has been exposed line by line.

4. Continuous scan mode: essentially the same as pulse mode except that a substantially constant radiation system 102 is used and the pattern on the array of individually controllable elements 114 is updated as the projection beam 110 scans across the substrate 114 and exposes it.

Combinations and/or variations on the above described modes of use or entirely different modes of use may also be employed.

Exemplary Applications

Figure 4:
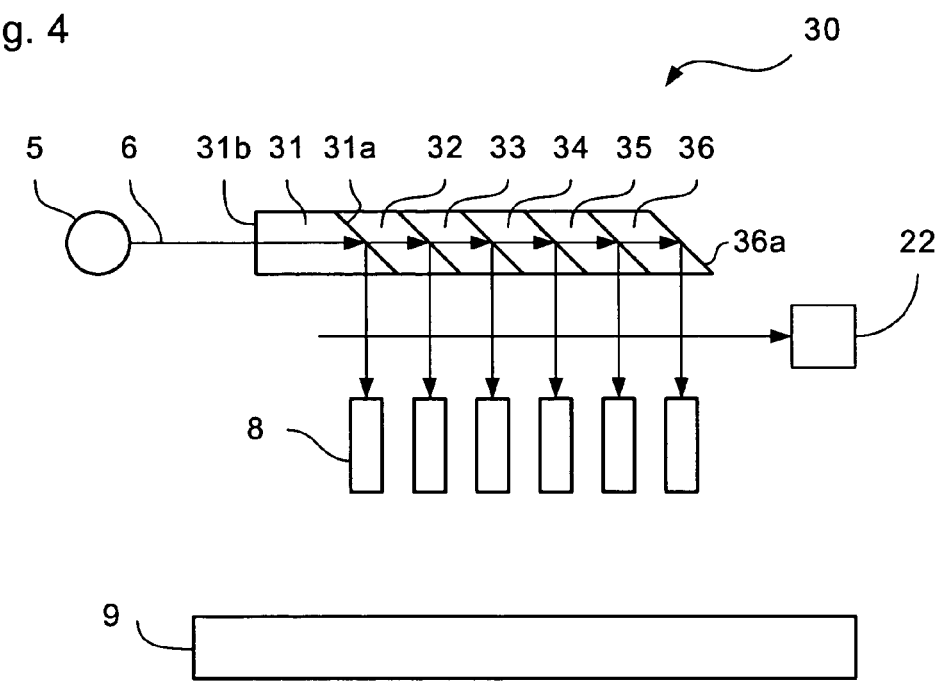
FIG. 4 depicts the arrangement of part of the apparatus according to a third embodiment of the invention.
Figure 3:
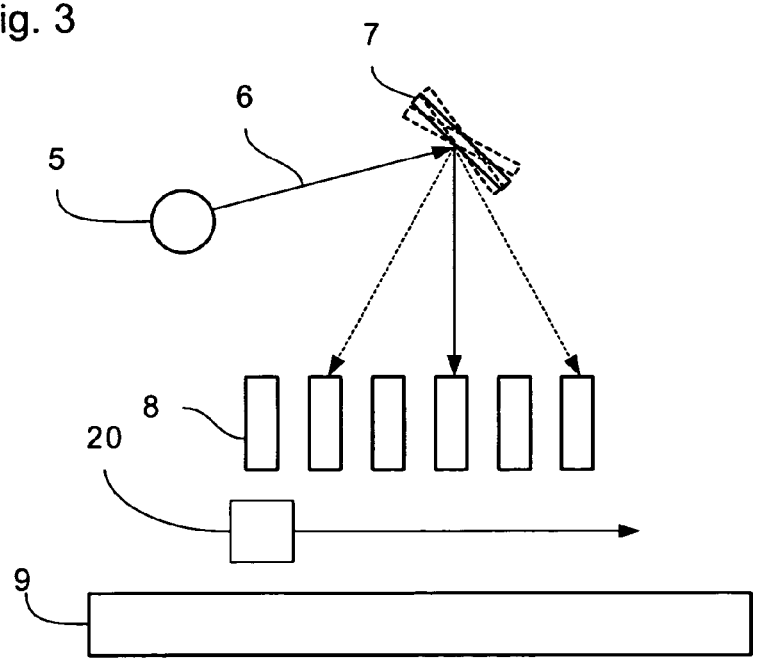
FIG. 3 depicts the arrangement of part of the apparatus according to a second embodiment of the invention.

FIGS. 2, 3 and 4 schematically represent part of a lithographic projection apparatus according to various embodiments of the present invention. An illumination system 5;60 produces a beam of radiation 6 which is, in the cases of FIGS. 3 and 4, distributed by a radiation distribution system 7 to a plurality of light engines 8 which pattern the radiation beam and project it onto a substrate 9. Each light engine 8 includes an array of individually controllable elements for patterning a beam of radiation according to a desired pattern and a projection system for projecting the patterned beam onto the substrate. The light engines may also include additional elements for preparing the beam of radiation prior to it being incident on the array of individually controllable elements. For example, it may include components to compensate for the angle at which the light engines 8 receive the radiation from the radiation distribution system 7.

It will be appreciated that instead of having separate projection systems, a plurality of the light engines may be arranged with a common projection system for simultaneously projecting the patterned beams generated by the arrays of individually controllable elements onto the substrate. Each channel may also have a partial mirror to deflect an amount of the input radiation in order continuously to monitor the intensity of the radiation in each channel. Furthermore, it will also be realized that the present invention is not limited to use with arrays of individually controllable elements for patterning the beams of radiation. In general, any patterning device for imparting a pattern to the cross-section of the beam of radiation may be used in place of the arrays of individually controllable elements described.

FIG. 2 depicts an embodiment in which there are several radiation sources 60a, 60b, 60c, 60d, 60e and 60f, each supplying one light engine 8. Any combination of numbers of radiation sources and light engines are possible, with radiation from one source being divisible between a plurality of light engines 8 as described below or radiation from a plurality of sources being combinable to be input into a single light engine. With a plurality of sources supplying radiation to a plurality of light engines, in-line radiation dose monitoring may be carried out using detector system 62. The detector system may comprise a separate detector for each radiation source 60 and involve a calibration step between the detectors, and/or it may comprise a smaller number of detectors that move between the radiation beams. Using partial mirrors and/or other optical guides, a portion of each of the beams can be directed to a detector that monitors the beam intensities.

A radiation distribution system 7 is depicted in FIG. 3 and comprises a reflector that is rotatably mounted in the path of the beam of radiation 6 from the illumination system 5. At different angles of rotation, the reflector reflects the beam of radiation 6 from the illumination system to different light engines 8. Accordingly, as a driver (not shown) rotates the reflector 7, the radiation from the illumination system 5 is directed to each of the light engines 8 in turn. The reflector 7 may be arranged to rotate reciprocally such that the radiation is directed backwards and forwards along the line of light engines 8. In order to achieve this, the reflector may be actuated by piezo-electric actuators, by electro-static actuators, by Lorentz actuators or by any other appropriate device. Alternatively, the reflector may be arranged to rotate at a constant speed around an axis such that the radiation is directed repeatedly along the row of light engines 8. The rotating reflector of the radiation distribution system 7 may be a planar element as shown in FIG. 3. In such an arrangement, both sides of the planar element may comprise reflective surfaces such that for each half turn of the element, the radiation is distributed to each of the light engines 8 in turn. Alternatively, the rotating reflector may be any shape that, as it rotates, directs radiation to different light engines 8. In one example, the planar reflector of the radiation distribution element is replaced by a radiation distribution element with a plurality of reflective surfaces mounted around an axis, in the shape of an irregular polygon. As the radiation distribution element rotates, each reflective surface in turn intersects the beam of radiation 6 from the illumination system 5. During each such pass, the angle that each reflective surface presents to the beam of radiation 6 from the illumination system 5 changes. Consequently, a beam of radiation reflected from the reflective surface also changes direction during that time. Therefore, in a manner corresponding to that described above in relation to the first embodiment, each reflective surface can be used to distribute the radiation between each of the radiation distribution channels in turn during the time that it intersects the beam of radiation 6 from the illumination system 5.

It will be appreciated that, although the figures show the light engines 8 arranged in a single row, in practice the light engines may be arranged in any fashion, for example in two or more rows, as convenient. Therefore the radiation from the illumination system 5 will need to be distributed in direction perpendicular to the plane of the figures as well as in the plane as shown. This may be arranged by enabling the reflector of the radiation distribution system 7 to not only rotate about an axis perpendicular to the plane of, say, FIG. 3 but also, perhaps by a more limited extent, about a second, orthogonal, axis. Alternatively, the reflector may distribute the radiation about a single axis as shown in FIG. 3 and distribution elements may be provided to carry the radiation to the light engines 8.

As a further variation, the radiation from the radiation distribution element 7 may not be directed to each light engine directly. Instead, each radiation distribution channel may include one or more radiation beam splitters for dividing the radiation directed to that channel at any given instant and distributing it to two or more light engines. Similarly, each light engine may include one or more arrays of individually controllable elements that are illuminated in the same field and/or share a common projection system.

Though the illumination system 5 generally uses a constant source (for example a constant UV source for the production of flat panel displays), the illumination system 5 may produce pulses of radiation at regular intervals, namely includes a pulsed radiation source. In this case, the rotation of the radiation distribution element 7 is synchronized to the pulse rate of the illumination system 5. For example, the synchronization may be such that during a single rotation of the radiation distribution element 7 (or half-turn if, for example, the element is rotating at a continuous speed and is double-sided), the illumination system provides pulses of radiation at each point that the reflector is at the required angle to reflect radiation to each of the radiation distribution channels (or directly to the light engines 8 as shown in FIG. 3). Alternatively, for example, the synchronization may be such that during each turn, the illumination system provides a pulse for only one of the radiation distribution channels or provides radiation to alternate channels in each rotation.

It will be appreciated that other duty cycles can also be considered. For example, if, as discussed above, the light engines 8 are arranged in more than one row, the synchronization may be such that in each rotation of the radiation distribution element 7 about an axis perpendicular to the plane of FIG. 3, the illumination system provides pulses of radiation for each of the light engines 8 in a single row. Subsequently, the radiation distribution element is moved about the second axis and the next rotation of the radiation distribution element 7 delivers radiation to another row of light engines.

Consequently, as described above, the radiation distribution element 7 has a duty cycle in which the radiation from the illumination system is distributed to a plurality of radiation distribution channels in turn. Each of the radiation distribution channels subsequently directs the radiation to one or more light engines containing arrays of individually controllable elements for patterning the beams of radiation. Therefore, while one array of individually controllable elements is being illuminated and the consequent patterned beam of radiation is being projected onto the substrate, other arrays of individually controllable elements may be having the next pattern being set. This is useful because a pulsed radiation source may be able to provide pulses of radiation faster than the arrays of individually controllable elements can be set to new patterns. Therefore, by distributing the pulses of radiation from a single illumination system to a plurality of arrays of individually controllable elements, the illumination system can be used more efficiently and the size and cost of the apparatus is less than if independent illumination systems were required for each light engine, for example.

It will be appreciated that, in addition to synchronizing the radiation distribution system to the pulsed radiation source, it is necessary to synchronize both of these with the updating of the pattern on each of the arrays of individually controllable elements.

For a given number of light engines that are being used to project patterned beams of radiation onto the substrate, the apparatus may include an illumination system with the same number of radiation sources as there are light engines, a system for combining the beams of radiation produced by each of the sources and, subsequently, a radiation distribution system as described above or below, for re-distributing the radiation between each of the light engines.

It will be appreciated that, in general, any number of sources may be used in conjunction with any number of light engines. Additionally, even if the intensity of the combined beam of radiation does still vary to some extent, variation between the intensities of the beams of radiation being patterned and projected onto the substrate at a given time will be reduced in comparison with an apparatus using a plurality of independent illuminations system associated with each light engine.

FIG. 2 depicts a series of detectors 62 which monitor the intensity of the radiation being input in to the light engines and a detector 20 which monitors the intensity of the light after the light engines and projection system, substantially at substrate level. Using a combination of these detectors 62, 20 or individual detectors, it is possible to have a frequent calibration step in which the overall intensity of the system is calibrated and less frequent calibration steps which involve monitoring and compensating for the intensity distribution across each channel. The first, more frequent step may occur between each substrate and the latter, less frequent step may occur between each batch of substrates, for example. FIG. 3 shows detector 20 and FIG. 4 shows detector 22. Detector 22 moves along the radiation beams being input into the light engines 8 and measures their relative intensity. The detectors are moved along rails, for example, or a probe or optical guide can be moved along the inputs or outputs of the light engines, directing a portion of the radiation to the detector, which is static alongside the system. In fact, it is also possible to have a single large substrate level detector, which covers all of the light engines 8; or to have an array of partially overlapping detectors. The overlap in detector range can be used to calibrate the detectors more efficiently than with no overlap since the same distributed intensity of light impinges on at least two detectors.

Detectors may additionally or alternatively be placed within the light engines 8. These would serve the same purpose as detectors 62 of FIG. 2. The radiation intensity may be detected while the radiation is not required for projection to the substrate, or a portion of the radiation may be directed towards the detectors using a partial mirror or similar.

It is possible that, due to defects in the radiation distribution element 7 or variations in the radiation source 5, the radiation entering each of the light engines 8 is not uniform. If this is the case, the detector 22 feeds back the information to compensation system that compensates for the difference in intensity. Detector 20 can replace or complement detector 22 by measuring the intensity of the patterned radiation coming out of the light engines 8 destined to be projected onto the substrate 9. This detector measures any variations in radiation caused by the light engine itself, for example, as the radiation passes through the patterning device. Detector 20 may be more likely to be used in the case where each light engine has its own projection system. Placing a detector after the light engine is all the more important in that case, since variations in the projected radiation are more likely with more than one projection system simply because more elements are involved which require calibrating.

There are several ways in which variations in radiation can be compensated for. The first is via the patterning device. If a detector such as detector 22 measures radiation being input into the patterning device as being different from the rest of the input radiation intensities, it can feed this information to the patterning device, which alters the intensity of the pattern that is to be projected onto the substrate. If detector 20, for instance, measures a variation in the intensity of the patterned radiation relative to the other light engine outputs, it feeds the information back to a compensation system and any variation caused by the light engine can be compensated for by, for example, the offset of individually controllable elements to direct different amounts of radiation in order to keep the pattern the same but the intensity of the radiation in the pattern different (also known as gray-scale).

In one embodiment, the individually controllable elements in the patterning device can be offset in order to affect the intensity of each point in the pattern which is output from the light engine.

More specifically, one or more arrays of individually controllable elements receive the radiation from the projection system and the elements are separately offset in order to create the pattern, the pattern being formed by greater or lesser intensities of radiation being projected onto the substrate. If the intensity being provided to the individually controllable elements is higher than the input into other light engines, the elements can be offset by a different amount in order to change the gray scale and reduce the intensity of the radiation being directed to the projection system. On the other hand, the gray scale can be changed to increase the intensity being directed to the projection system if, for instance, it is found that the projection system associated with one light engine attenuates more radiation than the projection system association with another light engine.

Another way in which the radiation intensity can be made uniform is by installing attenuators, which attenuate radiation destined for or coming out of light engines, where the radiation projected from those light engines is greater than the rest of the light engines. The attenuation of the beam preferably occurs before the patterning device, though it could occur afterwards, because it is easier to attenuate a beam that has not yet been patterned than one that has. It is possible to attenuate only part of a beam, for example, by compensating for a lack of dose uniformity in each channel, but this is also preferably done before the beam has entered the patterning device.

FIG. 4 shows a different embodiment of the radiation distribution system. This provides a radiation distribution system that can simultaneously provide radiation to two or more radiation distribution channels (or light engines 8). In particular, if a pulsed illumination system is being used, the radiation distribution element 30 can divide each pulse between the radiation distribution channels. Furthermore, the arrangement shown can be used as a beam divider within one of the radiation distribution channels, as described above.

As shown in FIG. 4, the radiation distribution element 30 is comprised of a plurality of sections 31,32,33,34,35,36, each associated with a radiation distribution channel or light engine 8. Each section is comprised of a material which is substantially transmissive to the radiation used and, may be formed from rods of glass, quartz or $CaF_2$, in particular. It will be appreciated, however, that the cross-sectional shape of these sections may be any convenient shape and the sections need not be mechanically connected.

The first section 31 has a first end 31b that receives a beam of radiation 6 from the illumination system 5. At the other end, the first section has a partially reflective surface 31a arranged at an angle to the beam of radiation 6. A portion of the beam of radiation 6 is reflected out of the radiation distribution element 30 to an associated radiation distribution channel or light engine 8. The remainder of the beam of radiation passes through the partially reflective surface into the second section 32 of the radiation distribution element 30. As shown, the second section is conveniently shaped such that the end that receives the radiation has a shape corresponding to the partially reflective surface 31a of the first section. However, this need not be the case. The second section, 32 also has a partially reflective surface at the opposite end, similar to that of the first section that in turn reflects a portion of the remaining beam of radiation out of the radiation distribution element 30 and permits the remainder of the radiation to pass into the third section. This is repeated as necessary until the final section, in the example shown the sixth section 36, which has a fully reflective surface 36a for reflecting the remaining portion of the beam of radiation 6 from the illumination system 5 into the associated radiation distribution channel or light engine 8.

By suitable arrangement of the partially reflective surfaces, the radiation distribution element 30 can be arranged to divide the beam of radiation 6 from the illumination system 5 into a plurality of beams in each radiation distribution channel with equal intensity. For example, different coatings may be used on each of the partially reflective surfaces. Suitable materials for such coatings include fluorides such as cryolite. Furthermore, the proportions of the beam of radiation 6 that will be directed to each of the radiation distribution channels will remain constant over time. Therefore if the distribution of the radiation intensity is not perfectly even, the relative intensities in each of the radiation distribution channels may be measured and compensated for appropriately in the remainder of the apparatus as discussed above.

It will be appreciated that, as with the previous embodiments, the radiation distribution channels or light engines 8 may be arranged other than in a single row as shown in FIG. 4. In this case radiation distribution elements may be used to direct the radiation accordingly or variation of the arrangement of the radiation distribution element 30 shown in FIG. 3 may be used. For example, full reflectors may be arranged between one or more of the section of the radiation distribution element 30 such that the individual sections of the radiation distribution element 30 need not be aligned. Similarly, alternative configurations of the sections 31, 32, 33, 34, 35 and 36 may also be used. For example, the partially reflective surfaces of alternate sections may be angled in opposite directions, reflecting radiation out of the opposite side of the radiation distribution element to the first partially reflective surfaces. Plane reflectors may then be arranged to reflect all of the portions of the beam of radiation through 90° (for example, into the plane of FIG. 4), generating two parallel rows of beams of radiation that may be projected directly to two rows of light engines.

Figure 5:
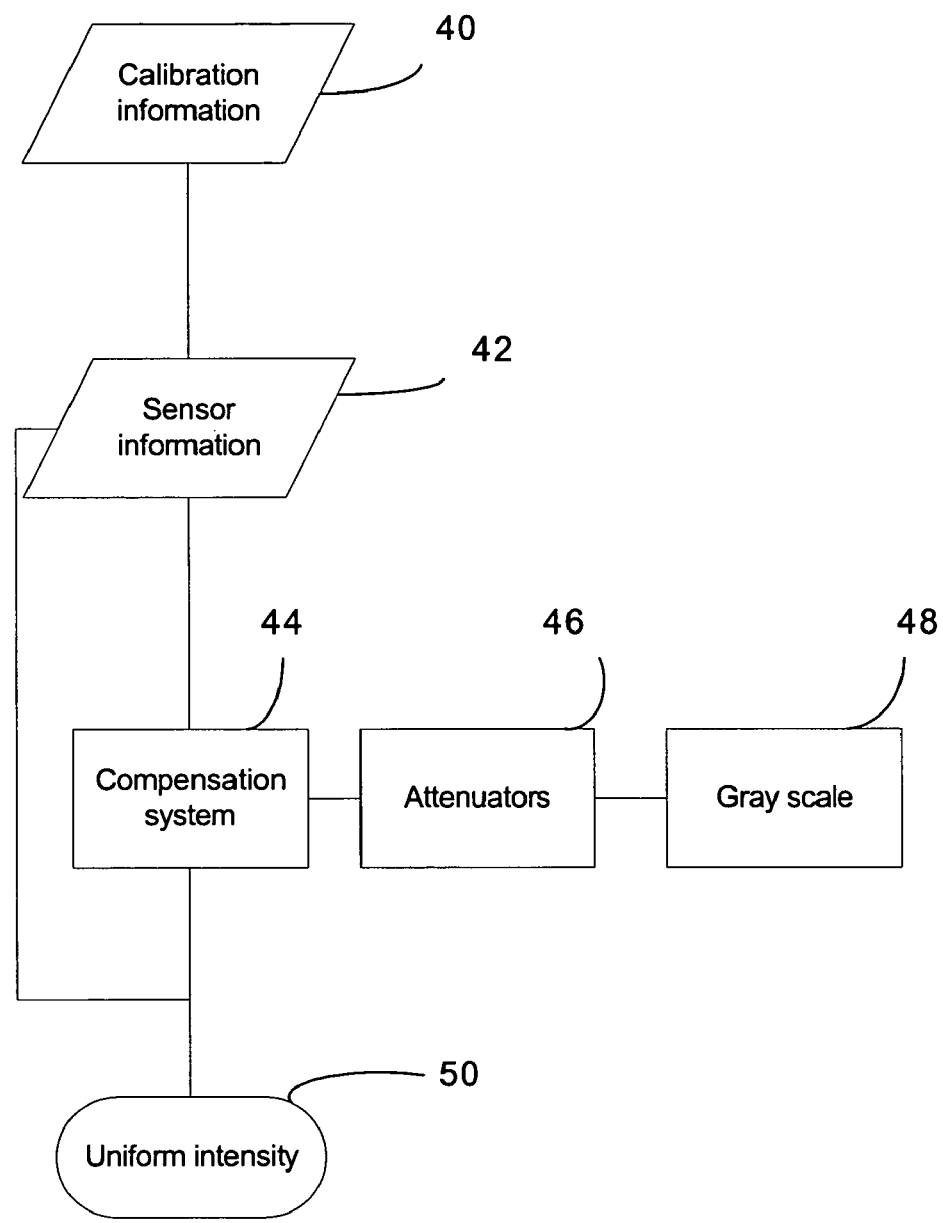
FIG. 5 depicts a flowchart of the feedback system according to the present invention.

The feedback system of the detectors and the compensation device is shown in FIG. 5. Calibration information 40 is determined during the set up of the lithographic apparatus. This information includes the intensity of the input radiation and the positioning of the patterning device required to pattern the radiation as required.

Between each patterning process of a substrate, the detectors 20, 22 or 62 monitor the actual intensity of the radiation either before or after the light engines 8 and compare the intensity of each light engine 8 with the intensity in other light engines and with the calibration information 40. If the intensity of the radiation measured by the detectors 20 or 22 in each light engine 8 is the same as the intensity in other light engines and the calibration information, the compensation system 44 need not come into play. If, however, there is a variation in intensity for a particular light engine 8, the compensation system 44 compensates for this variation using, for instance, gray scale capability of the patterning device 48 or attenuators 46 to attenuate excess radiation. The radiation output from all light engines becomes uniform. The output is optionally sensed by detector 20. This can determine that the compensation system has compensated for the variation as required. The detectors can also monitor information regarding the individual elements in an array of individually controllable elements. In this way, it is possible to adjust the intensity not only for an entire light engine, but also for individual elements by offsetting the monitored elements as required based on the information received.

Further input radiation is measured by the detectors 20 or 22 in order to determine whether the variation is still present and can be compensated for. If it is sensed that all light engines 8 have an equal offset, intensity compensation is possible not only with the individually controllable elements, but also with the source.

It is clear, of course, that any of the detectors may be used in any combination in any of the embodiments and they have been shown on separate embodiments here for clarity.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic projection apparatus, comprising:
a radiation system that provides a beam of radiation;
a plurality of patterning devices;
a radiation distribution device having radiation distribution channels that distribute respective portions of the radiation from the radiation system to respective patterning devices in the plurality of patterning devices, wherein the respective patterning devices pattern corresponding ones of the respective portions of the beam of radiation;
a radiation detection system that measures intensity of the radiation associated with each of the patterning devices; and
a projection system that projects the respective patterned beams onto a target portion of a substrate.

2. A lithographic projection system according to claim 1, wherein the radiation detection system comprises a detector that sequentially detects radiation associated with each of the patterning devices.

3. A lithographic projection system according to claim 2, wherein the detector moves across the respective portions of the radiation associated with each of the patterning devices.

4. A lithographic projection system according to claim 2, further comprising a probe associated with the detector, wherein the detector is substantially stationary and the probe moves across the respective portions of the radiation associated with each of the patterning devices.

5. A lithographic projection system according to claim 1, wherein the radiation detection system comprises detectors wherein each is associated with respective ones of the patterning devices.

6. A lithographic projection system according to claim 1, wherein the radiation detection system detects radiation exiting the radiation distribution system.

7. A lithographic projection system according to claim 1, wherein the radiation detection system detects radiation exiting the distribution channel.

8. A lithographic projection system according to claim 1, wherein the detection system detects radiation between the patterning devices and the projection system.

9. A lithographic projection system according to claim 1, wherein the detection system detects radiation exiting the projection system.

10. A lithographic projection apparatus according to claim 1, further comprising a compensation system that adjusts intensity of the radiation that is associated with at least one of the patterning devices and that is projected by the projection system.

11. A lithographic projection apparatus according to claim 10, wherein the compensation system independently adjusts the intensity of the radiation associated with each of the patterning devices.

12. A lithographic projection apparatus according to claim 10, wherein:
at least one of the patterning devices is an array of individually controllable elements that can be set to impart a beam of radiation with a desired pattern in its cross-section;
each of the individually controllable elements is set to one of a plurality of states during which a different proportion of the radiation is directed to the projection system; and
the compensation system adjusts the radiation by changing the settings for each of the individually controllable elements, such that the pattern of the radiation is maintained, while the intensity of the radiation changes.

13. A lithographic projection apparatus according to claim 12, further comprising a control system that updates the compensation system with previously detected and stored radiation intensity data when the radiation is projected onto a portion of the substrate, wherein the stored data is a measure of the intensity variation when the at least one patterning device is set so that all the individually controllable elements are set to the same state.

14. A lithographic projection apparatus according to claim 10, wherein the compensation system comprises a radiation attenuator that attenuates the radiation that is associated with at least one patterning device and that is projected by the projection system.

15. A lithographic projection apparatus according to claim 10, wherein the compensation system adjusts the intensity of the respective portion of the radiation that is associated with at least one patterning device and that is projected by the projection system.

16. A lithographic projection apparatus according to claim 10, further comprising a control system that updates the compensation system with previously detected and stored radiation intensity data when the radiation is projected onto a portion of the substrate.

17. A lithographic projection apparatus according to claim 10, further comprising a control system that updates the compensation system with previously detected radiation intensity data when radiation is projected onto a portion of the substrate, wherein the previously detected radiation intensity data corresponds to data detected by the radiation detection system before a current operation that is stored in a storage medium.

18. A lithographic projection apparatus according to claim 10, wherein:
the radiation detection system detects variation in radiation intensity in at least one of the radiation distribution system and the radiation distribution channels for each of the patterning devices; and
the compensation system is arranged to compensate for this variation in radiation intensity.

19. A lithographic projection apparatus according to claim 10, wherein:
the radiation detection system is arranged to detect variation in radiation intensity in the projection system for each of the patterning devices; and
the compensation system is arranged to compensate for this variation in radiation intensity.

20. A method of calibrating the radiation intensity in a lithographic projection apparatus, comprising:
detecting intensity of radiation at any of a number of stages in a lithographic projection apparatus when individually controllable elements of each patterning device in a plurality of patterning devices are set to a same state;
storing the radiation intensity data for any of the number of stages in a storage medium;
detecting the intensity of the radiation at the same stages in the lithographic projection apparatus while it is in use;
using a control system to compare the stored data with data acquired while the lithographic projection apparatus is in use; and
using a compensation system to adjust the intensity of the radiation associated with at least one of the patterning devices in accordance with an output of the control system.

21. A device manufacturing method, comprising:
distributing portions of a beam of radiation from a radiation system through radiation distribution channels of a radiation distribution device to respective patterning devices in a plurality of patterning devices;
detecting radiation intensity of the respective portions of the beam of radiation in the radiation distribution channels;
patterning the respective portions of the beam using the respective patterning devices; and
projecting the patterned beams of radiation onto a target portion of a substrate.

22. A device manufacturing method, comprising:
distributing respective beams of radiation via a plurality of radiation distribution channels of a radiation distribution device from a radiation source to respective patterning devices in a plurality of patterning devices;
determining a radiation intensity value for each respective one of the radiation distribution channels;
compensating the respective beams of radiation for any difference between the radiation intensity values before the respective beams of radiation reach the respective patterning devices;
patterning the respective beams of radiation; and
projecting the patterned beams of radiation onto a target portion of a substrate.

* * * * *